June 25, 1968 J. MARLEY 3,390,308

MULTIPLE CHIP INTEGRATED CIRCUIT ASSEMBLY

Filed March 31, 1966 2 Sheets-Sheet 1

INVENTOR.
JOHN MARLEY

BY [signature]

ATTORNEY

June 25, 1968 J. MARLEY 3,390,308

MULTIPLE CHIP INTEGRATED CIRCUIT ASSEMBLY

Filed March 31, 1966 2 Sheets-Sheet 2

INVENTOR.
JOHN MARLEY
BY [signature]
ATTORNEY

United States Patent Office 3,390,308

Patented June 25, 1968

3,390,308

MULTIPLE CHIP INTEGRATED CIRCUIT ASSEMBLY

John Marley, Wayne, N.J., assignor to International Telephone and Telegraph Corporation, a corporation of Delaware Filed Mar. 31, 1966, Ser. No. 539,003
2 Claims. (Cl. 317—100)

ABSTRACT OF THE DISCLOSURE

This is an invention of a multiple chip integrated assembly comprising a film substrate with integrated circuit chips assembled in openings in said substrate. A heat sink film of conductive material is disposed in juxtaposed heat conductive relation to the underside of the chips. Electrical connections are made to said chips by cantilever leads which are integrally connected to circuit connection leads on the film substrate, with certain of said connection leads coupled to said heat sink film.

This invention relates to microelectronics and more particularly to a multiple integrated circuit chip assembly.

In conventional microelectronic assembly techniques, the microcircuit devices are generally constructed by placing an integrated circuit chip within a device enclosure. Within the enclosure, wire bonding techniques which are generally performed by human operators are used to provide interconnection between the microcircuit chip and the container electrodes. In turn, a group of such microcircuit devices individually enclosed in such multielectrode containers are further interconnected to perform a useful electronic equipment assembly function. Such wire bonding and device electrode connection techniques introduce a multiplicity of material interfaces and interconnections with consequent complexity of construction and impairment of device reliability. Previous methods for providing assembly interconnections between uncontained microcircuit or silicon integrated circuit chips, generally known as "flip-chip" approaches, exhibit difficulties in the registration or location of the chips to the substrate interconnection pads, exhibit reliability problems at the interface between the chips and the substrate due to differential expansion and contraction effects, and cannot economically provide more than a single layer of interconnection on the supporting substrate thus severely limiting the quantity of chips which can be organized in a single assembly.

It is an object of this invention to provide a simple and direct interconnection means between a group of uncased integrated circuit chips (dice) or other microcircuit chips each having a multiplicity of metallic lands.

It is another object of this invention to provide a reliable interconnection means which provides sufficient resiliency between the interconnection means and each of the group of chips so that differential thermal expansion and contraction stresses do not overstrain the interface bonds at the metallic lands.

It is a further object of this invention to provide a multilayer interconnection means which permits topology solutions to interconnection requirements having a high degree of complexity and quantity of crossover and feedthrough requirements.

It is still another object of this invention to provide an interconnection means for a group of chips which has built-in alignment structure to permit assembly of the chips to the interconnection means without micro-optical guidance from a human assembler.

A feature of this invention is a multiple integrated circuit chip assembly which comprises a thin flexible printed wiring panel which includes window-like openings for integrated circuit chips, integrated circuit chips having metallic lands thereon for connections thereto disposed within the window-like openings, etched ribbon leads integrally attached to the printed wiring panel which cantilever out over the chips, and means bonding ends of said cantilevered ribbon leads to the metallic lands on said chips.

The above-mentioned and other features and objects of this invention will become more apparent by reference to the following description taken in conjunction with the accompanying drawings, in which.

Figure 1:
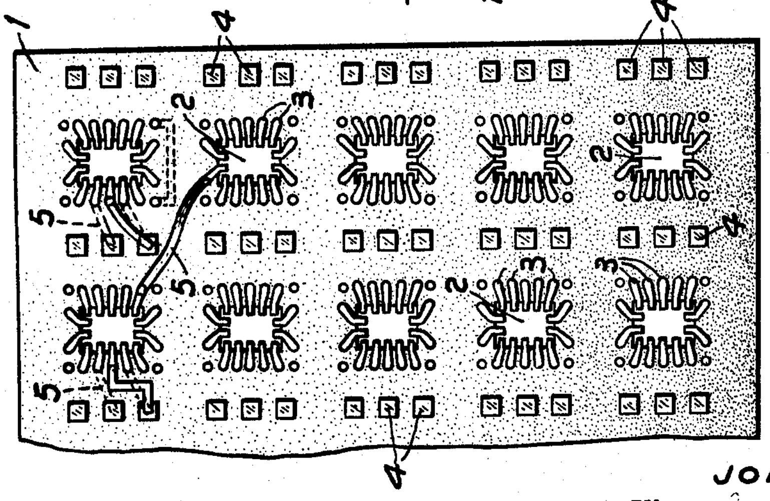
FIGURE 1 is a plan view of a portion of a printed wiring panel showing a typical pattern of groupings of ribbon leads cantilevered over window openings and a few typical conductor paths.

With reference to FIGURE 1, there is shown a printed wiring panel 1 which consists essentially of a metal foil laminated plastic dielectric sheet such as polyester or polyimide resin with copper foil bonded to both sides which is etched to produce the two-layer printed wiring conductor paths for interconnection between chips and connection electrodes for signal currents exterior to the assembly. There are shown a regular array of window openings 2 in which will be disposed integrated circuit chips, and surrounding the windows 2 a plurality of ribbon leads 3 cantilevered from the panel 1 and overhanging each window 2. The structure of these ribbon leads will be described more particularly with reference to other figures herein. Disposed between the windows are a plurality of pads 4 which are shown as square pads in FIGURE 1 but which may be any shape desired. These pads are used as exterior connection electrodes and for electrical feedthrough purposes. For illustration purposes, there are shown a number of interconnecting etched conductor paths such as 5 which interconnect the various integrated circuit chips. To avoid unnecessary detail and to show this invention with clarity, only a few of the interconnections are shown.

Figure 2:
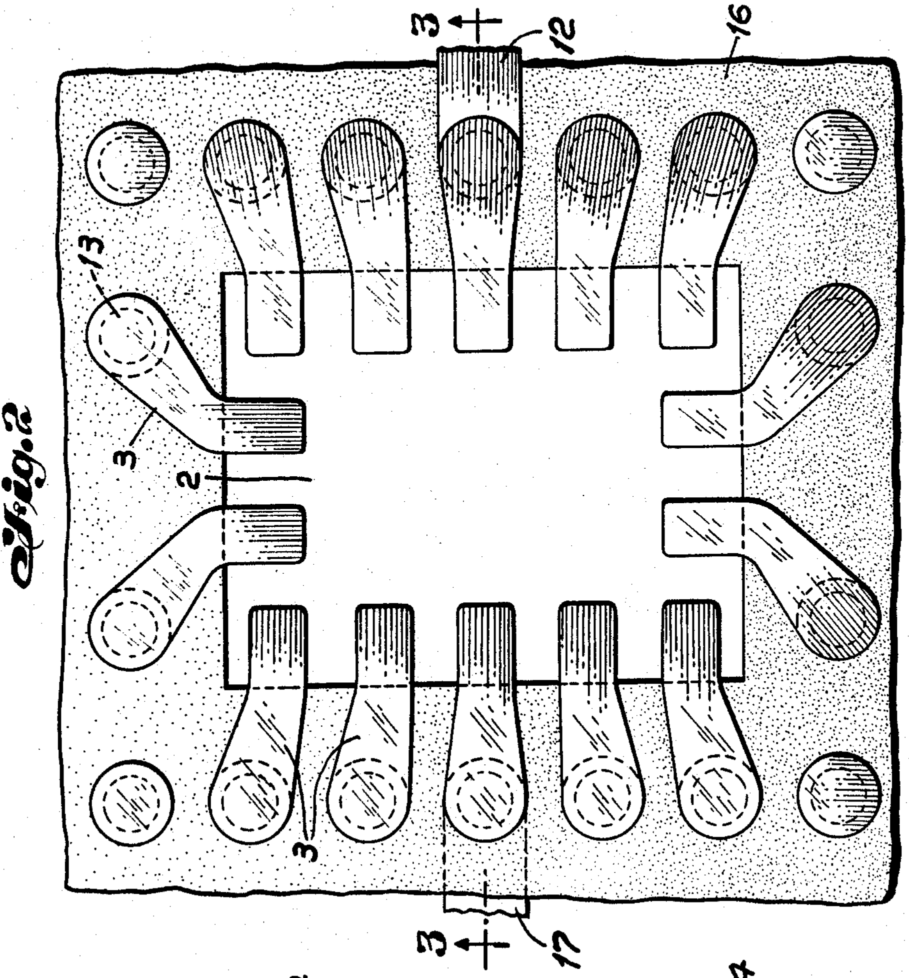
FIGURE 2 shows a portion of the printed wiring panel of FIGURE 1 enlarged to show detail of the window opening therein for receiving the integrated circuit chips and detail of the cantilevered ribbon leads used to provide electrical bonding to the chips.
Figure 3:
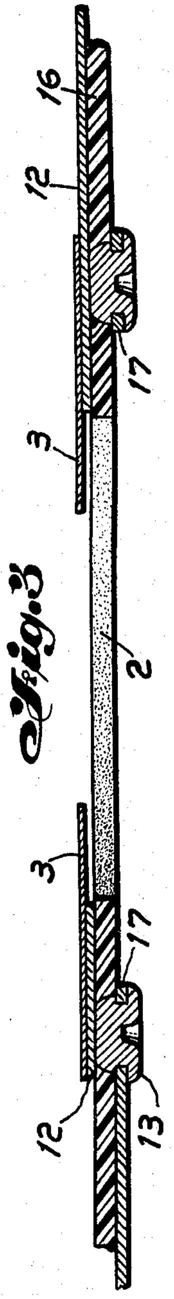
FIGURE 3 is a cross-section view of FIGURE 2 along line 3—3.

FIGURES 2 and 3 disclose in more detail the windows 2 and the cantilever ribbon leads 3. The size of the window opening is sufficient to receive a conventional integrated circuit chip or die; which may be somewhat smaller than the overall size of the die so that a tight fit would result. The cantilevered ribbon leads 3 are formed from deposited nickel or other metal compatible to electrical bonding with the particulars of the chip design. the cantilevered ribbon leads are made flexible by having a thin cross-section whereby differential thermal expansions and contractions between the integrated circuit chips and a heat sink (to be described later) generate a minimum of transmitted stress to the bonds. In certain variations of these cantilevered ribbon leads, they may be an integral etched portion of the original foil clad to the laminate. A feed-through riser 13 is disposed in a small opening in the dielectric sheet 16 and interconnects the copper foil 12 on the cantilevered ribbon lead side of the printed wiring panel with the copper foil 17 on the opposite side thereof. Interconnections 5 within the printed wiring panel which join one cantilevered ribbon lead with another can thus be made on either side of the panel 1 as required to avoid conflict with other independent interconnections. For illustration purposes conductors which lie on the far side are symbolized as dotted lines in FIGURE 1 and FIGURE 2. The riser 13 can be plated up within the hole in the dielectric sheet 16 by conventional means and may be either nickel or copper or other suitable metal. The copper foil layer 12 underlying each cantilevered ribbon lead 3 has been chemically etched away in the exposed portion overlying the window opening. The overlying portion of each ribbon lead thus overhangs the window in cantilever fashion to the extent necessary to permit registration and bonding with the corresponding metallic land of the integrated circuit chip.

Figure 4:
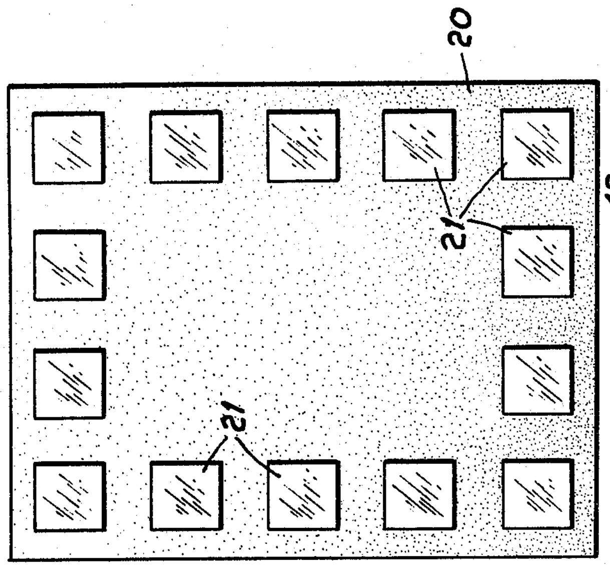
FIGURE 4 is a plan view of a typical integrated circuit chip.

FIGURE 4 discloses a typical integrated circuit chip or die 20 which contains a plurality of circuit elements as is well known in the art and which has a plurality of metallic connection lands 21 to which the desired circuit elements within the integrated circuit chip are connected and to which connections are made with other integrated circuit chips or to other circuit elements outside the integrated circuit chips. An example of such a chip which is suitable for incorporation in this printed wiring panel is ITT–SL–300 as made by International Telephone and Telegraph Corporation.

Figure 5:
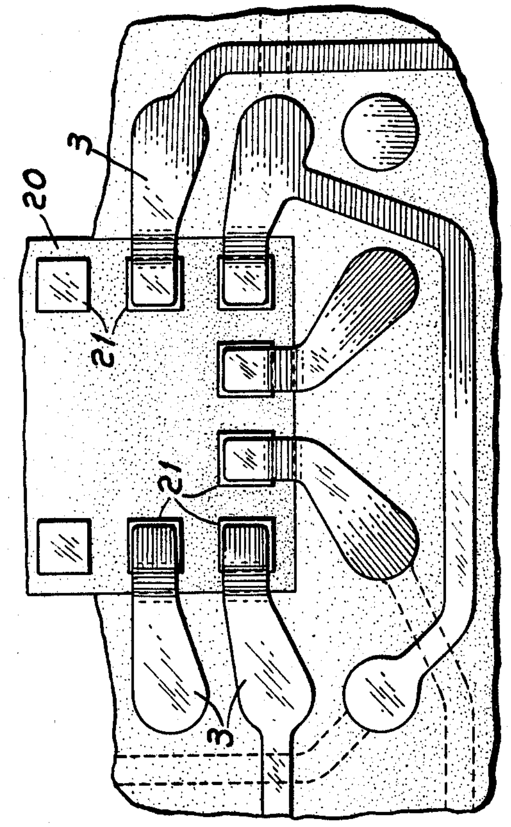
FIGURE 5 is a partial plan view of a portion of a printed wiring panel having two etched wiring layers showing the integrated circuit chip in position in the window opening with a number of cantilevered ribbon leads bonded thereto.
Figure 6:
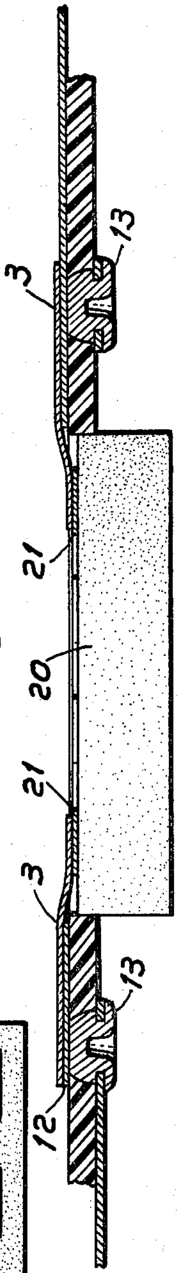
FIGURE 6 is another cross-section view showing the integrated circuit chip positioned in the window and the ends of the cantilevered ribbon leads bonded thereto.

With reference to FIGURES 5 and 6, there is shown the assembly of the integrated circuit chip 20 into a window of the panel 1 and the bonding of the cantilevered ribbon leads 3 to the corresponding lands 21 on the integrated circuit chip. To insure good bonding registration or congruency of the ribbon lead end against the metallic land, the ribbon lead end is made somewhat smaller than the metallic land outline and the window opening is designed to have a conforming fit to the outline of the chip.

Figure 7:
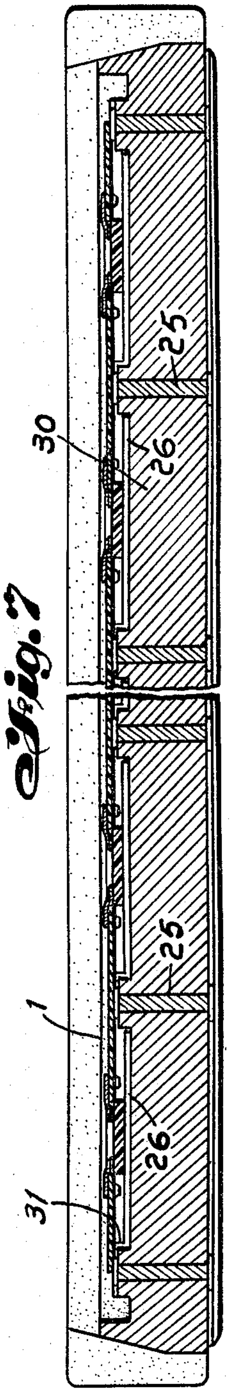
FIGURE 7 is a side elevation view of a printed wiring panel and assembled integrated circuit chips with mechanical and electrical connections thereto.

FIGURE 7 shows an example of a multiple integrated circuit chip assembly mounted on a microcomponent board 30 or similar supporting structure. Interconnections to the pads 4 of the printed wiring panel 1 are shown made via posts 25 which serve a double function. These posts can be nickel or copper or other suitable material welded or soldered to the pad 4 and serve the function of supporting the panel 1 and also making external electrical connection to the panel 1. To provide mechanical support and heat sinking for the integrated circuit chips, there is shown a heat conducting member 26 disposed beneath the substrate and physically bonded to the integrated circuit chips and which provides a large area for heat dispersion as well as mechanical support to the chips. The heat sink element 26 may be alumina, anodized aluminum, or other combinations of metallic and dielectric layers as may be desired, and can be fastened to the supporting structure 30 by any known means. The heat sink element 26 may be a film substrate in which case the posts 25 may interconnect the printed wiring panel 1 to the film substrate, both electrically and mechanically, as indicated at 31.

While I have described above the principles of my invention in connection with specific apparatus, it is to be clearly understood that this description is made only by way of example and not as a limitation to the scope of my invention as set forth in the objects thereof and in the accompanying claims.

I claim:

1. A multiple chip integrated circuit assembly comprising;

a substrate having circuit connection leads thereon, said substrate having openings therethrough, integrated circuit chips disposed in said openings, said integrated circuit chips having lands thereon, cantilever ribbon leads disposed about the periphery of said openings, each electrically interconnecting one of said circuit connection leads to one of said lands, a heat sink film in juxtaposed heat dispersion relation to said integrated circuit chips, and means connecting electrically said film to certain of said circuit connection leads of said substrate.

2. A multiple integrated circuit chip assembly according to claim 1, wherein said cantilevered ribbon leads are made flexible by having a thin cross-section, whereby differential thermal expansions and contractions between said integrated circuit chips and said heat sink film generate a minimum of transmitted mechanical stress to the electrical bonds.

References Cited

UNITED STATES PATENTS

| | | | |
|---|---|---|---|
| 3,248,774 | 5/1966 | Yuska et al. | 317—101 |
| 3,011,379 | 12/1961 | Corwin | 339—17 |
| 3,195,026 | 7/1965 | Wegner et al. | |
| 3,234,320 | 2/1966 | Chih Wong. | |
| 3,265,802 | 8/1966 | Hillman et al. | |

FOREIGN PATENTS

| | | |
|---|---|---|
| 1,009,789 | 11/1965 | Great Britain. |

ROBERT K. SCHAEFER, *Primary Examiner.*

D. SMITH, *Assistant Examiner.*